(12) United States Patent
Kim et al.

(10) Patent No.: US 8,063,982 B2
(45) Date of Patent: Nov. 22, 2011

(54) IMAGE SENSOR CAMERA MODULE INCLUDING A PROTRUDING PORTION AND METHOD OF MANUFACTURING THE SAME

(75) Inventors: Jin-Kwan Kim, Chungcheongbuk-Do (KR); Hwan Kim, Chungcheongbuk-Do (KR)

(73) Assignee: Optopac Co., Ltd., Chungcheongbuk-do (KR)

( * ) Notice: Subject to any disclaimer, the term of this patent is extended or adjusted under 35 U.S.C. 154(b) by 333 days.

(21) Appl. No.: 12/363,780

(22) Filed: Feb. 1, 2009

(65) Prior Publication Data

US 2010/0141825 A1    Jun. 10, 2010

(30) Foreign Application Priority Data

Dec. 10, 2008    (KR) .................... 10-2008-0124977

(51) Int. Cl.
*H04N 5/225* (2006.01)
(52) U.S. Cl. ...................... 348/374; 348/335
(58) Field of Classification Search .................. 348/335, 348/373–375
See application file for complete search history.

(56) References Cited

U.S. PATENT DOCUMENTS

| | | | | |
|---|---|---|---|---|
| 2005/0012032 A1* | 1/2005 | Onodera et al. | ........... | 250/214.1 |
| 2007/0212061 A1* | 9/2007 | Woo | ............... | 396/529 |
| 2007/0241273 A1* | 10/2007 | Kim et al. | ...................... | 250/239 |
| 2008/0246845 A1* | 10/2008 | Chan | ........................... | 348/207.2 |
| 2009/0033789 A1* | 2/2009 | Lin | ............... | 348/374 |

FOREIGN PATENT DOCUMENTS

| | | |
|---|---|---|
| CN | 101281284 A | 10/2008 |
| JP | 09-284617 | 10/1997 |
| JP | 2001-333332 | 11/2001 |
| JP | 2002-252797 | 9/2002 |
| JP | 2006-128755 | 5/2006 |
| JP | 2006-157420 | 6/2006 |
| JP | 2008-236226 | 10/2008 |
| KR | 2007-0078514 | 8/2007 |

* cited by examiner

*Primary Examiner* — Gevell Selby
(74) *Attorney, Agent, or Firm* — Portland IP Law LLC

(57) ABSTRACT

The present invention relates to an image sensor camera module and a method of manufacturing the same. An image sensor camera module according to the present invention includes a lens; a lens housing having the lens mounted thereto; an image sensor package adhering to a portion of an inside of the lens housing; and a protruding portion for maintaining a gap between the lens and the image sensor package, wherein the image sensor package adheres to the lens housing at an outside of the protruding portion. According to the present invention, since a lens barrel is not used and a focus adjusting process is not performed, the process simplification and automation process can be achieved, thereby saving a manufacturing cost and obtaining uniform focus quality. Further, it is possible to prevent an image defect from being generated by foreign substances, thereby improving a yield.

14 Claims, 7 Drawing Sheets

IMAGE SENSOR CAMERA MODULE INCLUDING A PROTRUDING PORTION AND METHOD OF MANUFACTURING THE SAME

This application claims priority to Korean Patent application No. 10-2008-0124977, filed on Dec. 10, 2008 and all the benefits accruing therefrom under 35 U.S.C. 119, the contents of which are herein incorporated by reference in its entirety.

BACKGROUND OF THE INVENTION

1. Field of the Invention

The present invention relates to an image sensor camera module, and more particularly, to an image sensor camera module, wherein a focus adjusting process is not performed, and a method of manufacturing the image sensor camera module.

2. Description of the Related Art

Image sensors are semiconductor devices capable of taking photographs of images of human beings or objects. The market of these image sensors has been rapidly expanded as they have been embedded into portable phones as well as digital cameras or camcorders commercially available. Such an image sensor is manufactured in the form of a camera module and mounted into the aforementioned apparatuses.

A camera module generally includes a lens, a holder, an image sensor and a printed circuit board, and is manufactured by a chip on board (COB), chip scale package (CSP) or chip on film (COF) method. In the camera module, the image sensor is electrically connected to the printed circuit board, and the holder is fixed on the printed circuit board. The lens is mounted to a lens barrel and fastened to a lens seating portion provided in the holder. An outer rim of the lens barrel and the lens seating portion are manufactured to have a shape of threads so that the lens barrel is threadedly fastened to the lens seating portion. After the lens barrel is fastened to the lens seating portion, the lens barrel and the holder adhere to each other using an adhesive.

In the conventional camera module, a focus adjusting process should be performed before the lens barrel and the holder are adhered to each other in order to adjust a distance between the lens barrel and the image sensor. Due to the focus adjusting process, an apparatus for focus adjustment is further required and a manufacturing time is increased, whereby an automation process can be hardly achieved.

In addition, during the process of fastening the lens barrel to the holder, particles are produced by the friction between the threads of the holder and the lens barrel. If such particles are introduced to the image sensor, an image defect may be caused in the camera module. Further, tilting of the image sensor and the holder may be caused during the process of manufacturing the camera module, and therefore, homogeneity of the focus quality of the camera module may not be achieved.

Meanwhile, since the conventional camera module should be mounted with a separate IR filter to pass through light having a specific wavelength band, increase of cost and deterioration of optical transmittance are inevitable. Moreover, it is difficult to mount the IR filter particularly when the flange back length (FBL) from the image sensor to the bottom of the lens is configured to be short, which makes it difficult to design a lens having a short FBL.

SUMMARY OF THE INVENTION

The present invention provides an image sensor camera module, wherein a focus adjusting process is not performed to achieve process simplification and an automation process, so that manufacturing cost can be saved and homogeneous focus quality can be achieved, and a method of manufacturing the image sensor camera module.

The present invention provides an image sensor camera module capable of preventing particles from being produced to improve a yield, and a method of manufacturing the image sensor camera module.

The present invention provides an image sensor camera module, wherein an IR cut-off filter is coated on an image sensor package so that the camera module can be manufactured even though a FBL is short, so that a height of the camera module can be reduced, and a method of manufacturing the image sensor camera module.

According to an aspect of the present invention, there is provided an image sensor camera module, which includes a lens; a lens housing where the lens is mounted; an image sensor package adhering to a portion of an inside of the lens housing; and a protruding portion for maintaining a gap between the lens and the image sensor package, wherein the image sensor package adheres to the lens housing at an outside of the protruding portion.

The lens housing may include a horizontal portion positioned in parallel with the image sensor package; and a lens seating portion extending upwardly from an inner edge of the horizontal portion to allow the lens to be seated thereon.

The lens housing may further include an extending portion extending downwardly from an outer edge of the horizontal portion.

The protruding portion may extend downward from an inside of the horizontal portion or extend from the lens.

The image sensor camera module may further include a printed circuit board on which the image sensor package is mounted, and a bottom surface of the extending portion may further adhere to a top surface of the printed circuit board.

The image sensor camera module may further include a passive device provided in a working area on the printed circuit board.

The image sensor package may include an image sensor chip; and a glass substrate electrically connected to the image sensor chip and provided on top of the image sensor chip.

The image sensor camera module may further include an IR cut-off filter coated on the glass substrate or an IR film attached on the glass substrate.

According to another aspect of the present invention, there is provided a method of manufacturing an image sensor camera module, which includes mounting an image sensor package onto a printed circuit board; adhering a lens housing to the image sensor package using an adhesive; and curing the adhesive, wherein the lens housing is mounted so that the adhesive is positioned at the outside of the protruding portion.

In the method of manufacturing the image sensor camera module, adhering the lens housing to the image sensor package may include mounting the lens housing to the image sensor package after the adhesive is applied to the image sensor package. Adhering the lens housing to the image sensor package may include injecting the adhesive between the lens housing and the image sensor package after the lens housing is mounted onto the image sensor package.

The lens housing may be formed to have an extending portion surrounding an outside of the image sensor package.

An adhesive may be applied to a bottom surface of the extending portion, and then, the lens housing may be mounted.

The method may further include injecting an adhesive between the extending portion and the printed circuit board after mounting the lens housing onto the image sensor package.

DETAILED DESCRIPTION OF THE INVENTION

Figure 1:
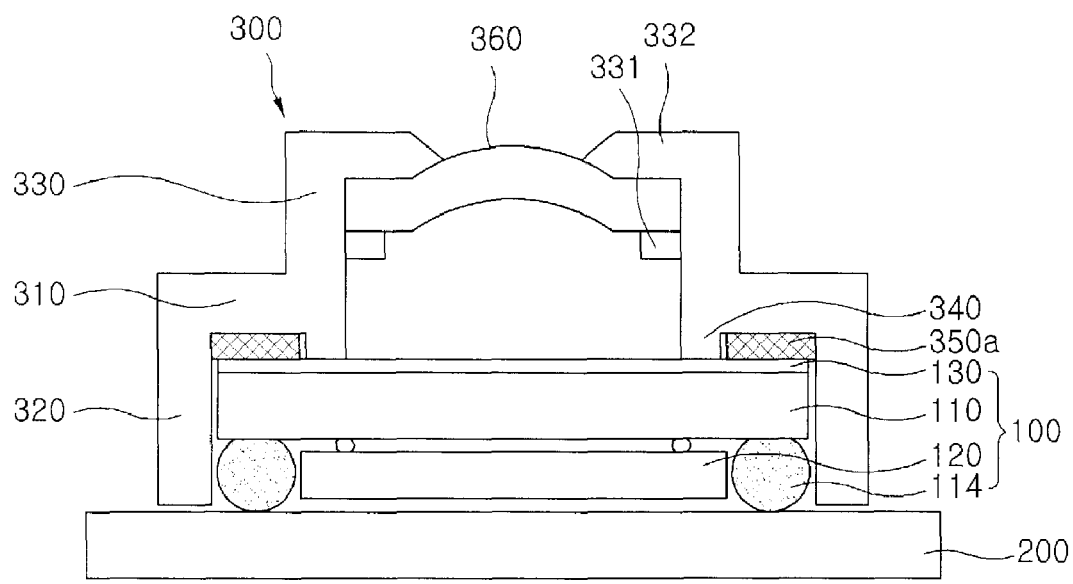
FIG. 1 is a sectional view of an image sensor camera module according to an exemplary embodiment of the present invention.

Hereinafter, exemplary embodiments of the present invention will be described in detail with reference to the accompanying drawings. However, the present invention is not limited to the embodiments disclosed below but may be implemented into different forms. These embodiments are provided only for illustrative purposes and for full understanding of the scope of the present invention by those skilled in the art. In the drawings, the thicknesses of layers and regions are exaggerated for clarity, and like reference numerals are used to designate like elements throughout the specification and drawings. Further, an expression that an element such as a layer, region, substrate or plate is placed on or above another element indicates not only a case where the element is placed directly on or just above the other element but also a case where a further element is interposed between the element and the other element.

Figure 2:
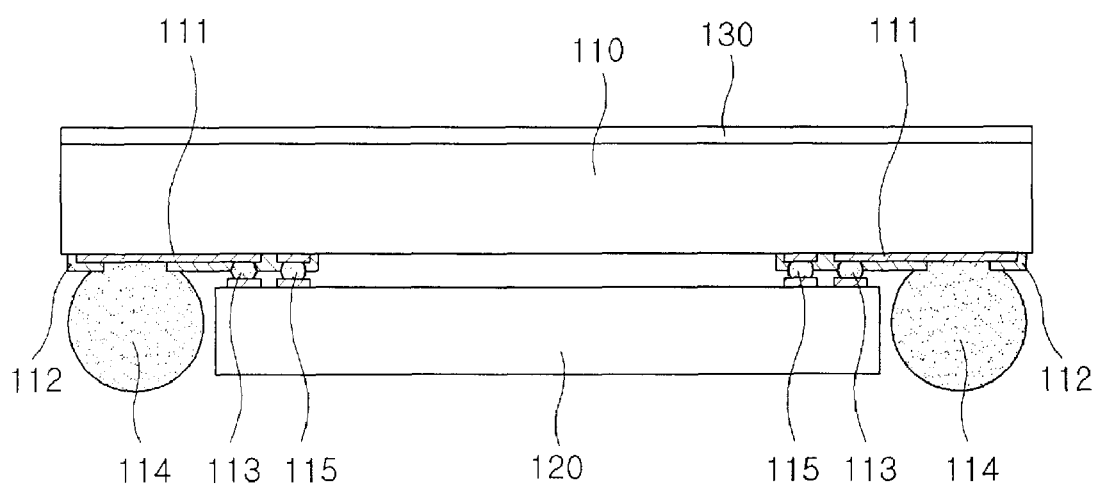
FIG. 2 is a sectional view of an image sensor package used in the image sensor camera module according to the exemplary embodiment of the present invention.

FIG. 1 is a sectional view of an image sensor camera module according to an exemplary embodiment of the present invention, and FIG. 2 is a sectional view of an image sensor package used in the image sensor camera module according to the exemplary embodiment of the present invention.

Referring to FIGS. 1 and 2, the image sensor camera module according to the exemplary embodiment of the present invention includes an image sensor package 100 having a glass substrate 110 and an image sensor chip 120, a printed circuit board 200 where the image sensor package 100 is mounted, and a lens housing 300 fixedly adhering to the image sensor package 100.

As shown in FIG. 2, the image sensor package 100 includes the glass substrate 110, metal traces 111 selectively formed on one side of the glass substrate 110, a passivation layer 112 formed on the metal traces 111 to isolate them, the image sensor chip 120 electrically connected to the metal traces 111 of the glass substrate 10 by flip-chip solder joints 113, and connection terminals 114 such as solder balls connected to the metal traces 111 of the glass substrate 110 at the outside of the image sensor chip 120. A dust-seal layer 115 is formed between the glass substrate 110 and the image sensor chip 120 to prevent particles from being inserted into the space between the glass substrate 110 and the image sensor chip 120. An IR cut-off filter 130 for transmitting or blocking light having a specific wavelength band may be coated on the other side of the glass substrate 110. Instead of the IR cut-off filter 130, an IR cut-off film may be attached to the glass substrate 110.

The printed circuit board 200 is electrically connected to the image sensor package 100 by the connection terminals 114 and has a circuit pattern printed thereon to thereby supply the image sensor package 100 with driving voltage and current applied from the outside. The printed circuit board 200 may include various types of printed circuit boards capable of supplying the image sensor package 100 with driving voltage and current applied from the outside, such as a single- or multi-layered printed circuit board, a metal printed circuit board and a flexible printed circuit board. In addition, a passive elements (not shown) such as a decoupling capacitor and the like may be mounted in a working area on the printed circuit board 200, i.e., a region except the region in which the image sensor package 100 is mounted.

The lens housing 300 includes: a horizontal portion 310 horizontally provided in parallel with the glass substrate 110 to partially cover an edge of the glass substrate 110; an extending portion 320 extending downwardly from an outer edge of the horizontal portion 310 to surround the outside of the image sensor package 100; and a lens seating portion 330 extending upwardly from an inner edge of the horizontal portion 310 to allow a lens 360 to be seated thereon. The lens housing 300 may be formed of a plastic or metal material having an electromagnetic shielding function.

Also, the lens seating portion 330 includes a lens support portion 331 horizontally protruding inwardly from a predetermined region thereof and a lens fixing portion 332 horizontally protruding inwardly from an upside of the lens housing 300. The lens support portion 331 may be formed to be detachably coupled to the lens housing 300, and the lens fixing portion 332 may be formed integrally with the lens housing 300. In this case, the lens 360 is fixed to the lens fixing portion 332, and the lens support portion 331 is coupled to the lens housing 300, so that the lens 360 can be seated on the lens seating portion 330. Alternatively, the lens support portion 331 may be formed integrally with the lens housing 300, and the lens fixing portion 332 may be formed to be detachably coupled to the lens housing 300. In this case, the lens 360 is fixed to the lens support portion 331, and the lens fixing portion 332 is coupled to the lens housing 300, so that the lens 360 can be seated on the lens seating portion 330. That is, any one of the lens support portion 331 and the lens fixing portion 332 is formed integrally with the lens housing 300, and the other is formed to be detachably coupled to the lens housing 300, so that the lens 360 can be seated on the lens seating portion 330. Here, the lens 360 may have a flat edge and a convex central portion, or have a flat edge and a flat central portion. The lens 360 may be made of glass or plastic. One lens 360, or two or more lenses 360 in some cases, may be seated in the lens housing 300 by controlling the number and position of the lens support portion 331 and lens fixing portion 332. When two or more lenses 360 are seated in the lens housing 300, a spacer (not shown) may be interposed between the lenses 360 so that a gap between the lenses 360 may be maintained. In the meantime, the lens 360 should be designed to achieve a highest resolution, and therefore, should be seated in the lens housing 300 considering a focus distance between the lens 360 and the image sensor chip 120. To this end, the length of the lens seating portion 330 and the position of the lens support portion 331 and lens fixing portion 332 may be considered in designing the lens 360.

A protruding portion 340 protruding downwardly and being spaced apart from the extending portion 320 is further provided at an inner portion of the horizontal portion 310. For example, the protruding portion 340 may protrude downward from a working area of the horizontal portion 310 corresponding to the lens seating portion 330. The protruding portion 340 is in contact with a top surface of the glass substrate 110 to maintain the distance between the image sensor chip 120 and the lens 360. Therefore, considering the distance between the top surface of the image sensor chip 120 and the lens 360, the length of the protruding portion 340 may be determined, or the position of the lens fixing portion 332 may also be adjusted. As the protruding portion 340 is provided, a predetermined space is defined between the protruding portion 340 and the extending portion 320, and between the glass substrate 110 and the horizontal portion 310. An adhesive 350a is applied to the space. Accordingly, the lens housing 300 adheres to the glass substrate 110 through the adhesive 350a. That is, in the image sensor camera module according to the present invention, the horizontal portion 310 of the lens housing 300 fixedly adheres to the image sensor package 100. The adhesive 350a may generally include a commercially available adhesive, such as a heat-cure adhesive which is cured by heat or a UV-cure adhesive. The protruding portion 340 may prevent the adhesive 350a applied to the glass substrate 10 from penetrating into an image region between the image sensor chip 120 and the lens 360. If the adhesive 350a penetrates into the image region, image sensing failure may occur. Particularly when the adhesive 350a is applied to a bottom surface of the protruding portion 340, the adhesive 350a may penetrate into the image region. In addition, if the adhesive 350a is applied to the bottom surface of the protruding portion 340, it is difficult to precisely adjust the gap between the image sensor chip 120 and the lens 360. Therefore, in the present invention, the adhesive 350a is applied to the space between the protruding portion 340 and the extending portion 320.

Figure 3:
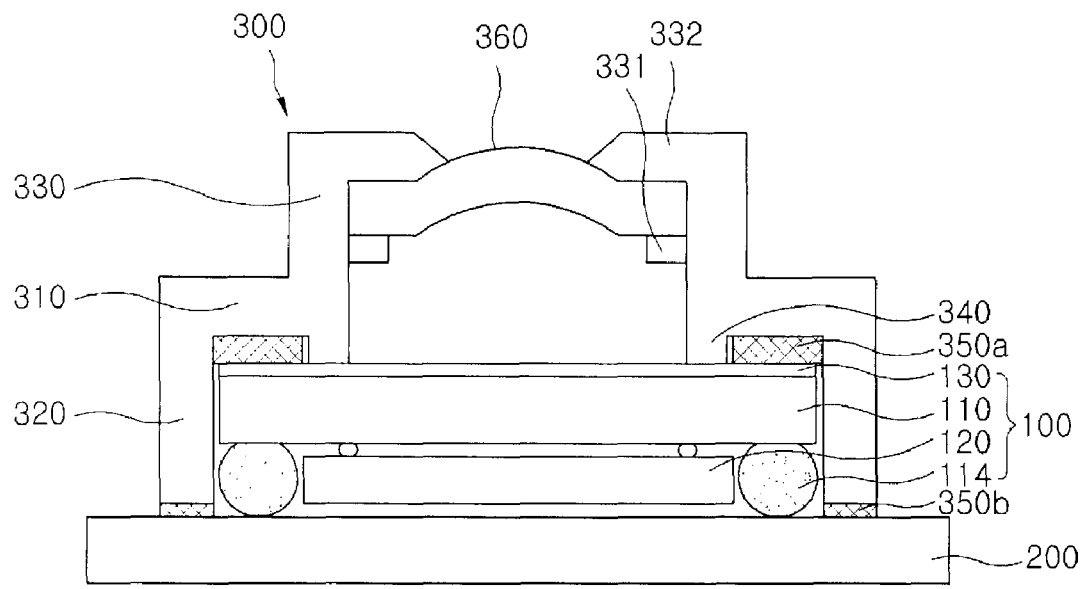
FIG. 3 is a sectional view of an image sensor camera module according to another exemplary embodiment of the present invention.

Meanwhile, the lens housing 300 may adhere to the printed circuit board 200 to block sidelight. As shown in FIG. 3, an adhesive 350b may be applied to the bottom surface of the extending portion 320 of the lens housing 300, thereby causing the extending portion 320 to fixedly adhere to the printed circuit board 200. Preferably, the same material as the adhesive 350a is used as the adhesive 350b.

To be specific, the adhesive 350a is coated on the glass substrate 10; the lens housing 300 is brought into contact with the glass substrate 110; the adhesive 350b is injected and coated into the space between the extending portion 320 and the printed circuit board 200; and the adhesive 350b is cured, whereby the lens housing 300 is adhered to the glass substrate 110 and the printed circuit board 200.

Differently, the lens housing 300 may fixedly adhere to the glass substrate 110 and the printed circuit board 200 after the adhesives 350a and 350b are applied to the glass substrate 110 and the printed circuit board 200, respectively. Alternatively, the lens housing 300 may adhere to the glass substrate 110 and the printed circuit board 200, after the adhesive 350a is applied to the glass substrate 110 and the adhesive 350b is applied to the bottom surface of the extending portion 320 by dipping the bottom surface of the extending portion 320 in an adhesive stage.

In the image sensor camera module according to the aforementioned exemplary embodiments of the present invention, after the lens 360 is seated in the lens housing 300, the lens housing 300 may adhere to the image sensor package 100 through the adhesive 350a, or the lens housing 300 may adhere to the image sensor package 100 and the printed circuit board 200 through the adhesives 350a and 350b. Further, since the gap between the image sensor chip 120 and the lens 360 can be precisely adjusted by the protruding portion 340, the conventional process of separately adjusting a focus distance between an image sensor chip and a lens is not required. Therefore, process automation and yield improvement can be achieved.

Figure 4:
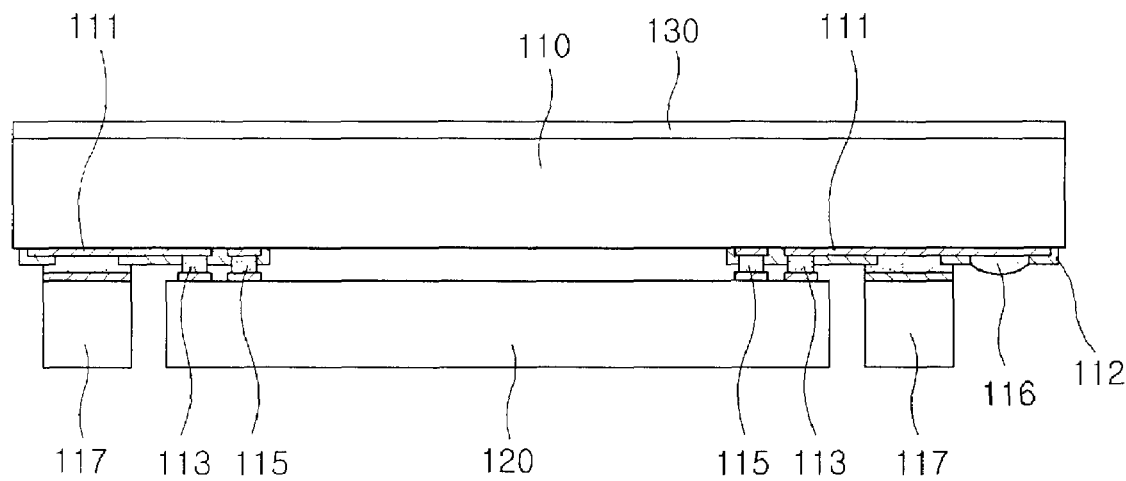
FIG. 4 is a sectional view of an image sensor package used in an image sensor camera module according to a further exemplary embodiment of the present invention.
Figure 5:
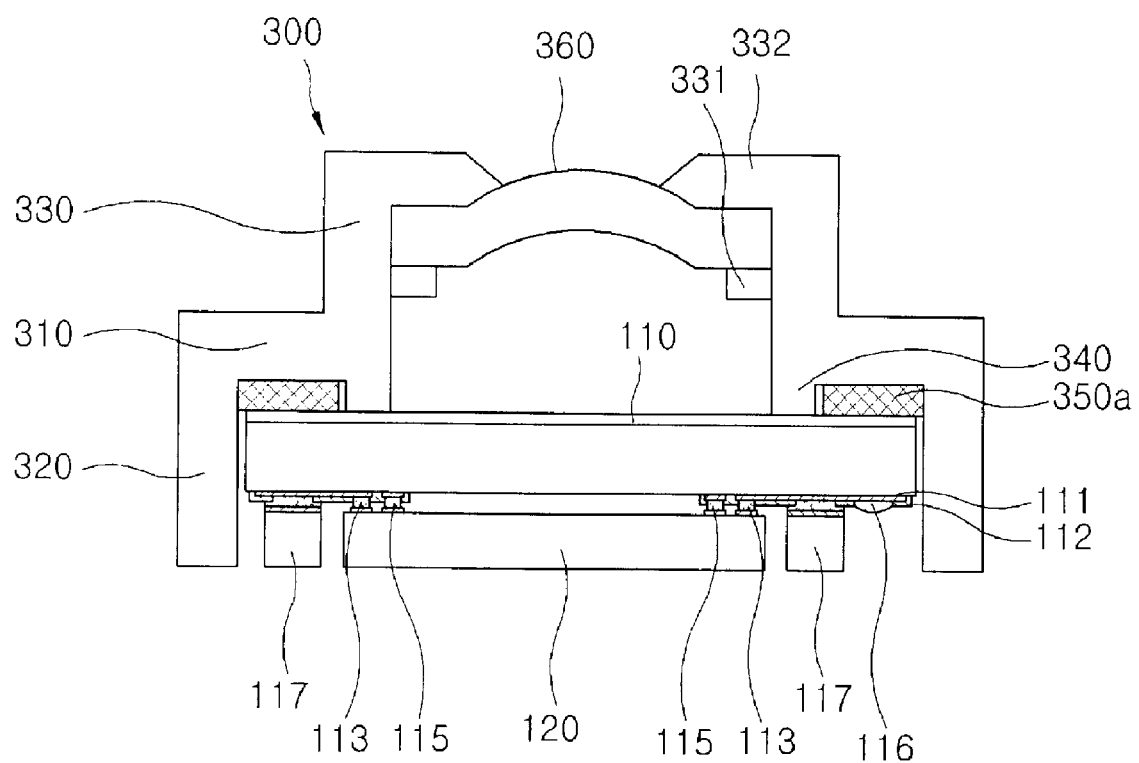
FIG. 5 is a sectional view of an image sensor camera module according to a still further exemplary embodiment of the present invention.

Meanwhile, as a further exemplary embodiment of the present invention, an image sensor camera module of FIG. 5 may be manufactured using the image sensor package shown in FIG. 4. FIG. 4 is a sectional view of an image sensor package according to a further exemplary embodiment of the present invention, and FIG. 5 is a sectional view of an image sensor camera module using the image sensor package of FIG. 4.

Referring to FIG. 4, the image sensor package according to the exemplary embodiment of the present invention includes a glass substrate 110, metal traces 111 selectively formed on one side of the glass substrate 110, a passivation layer 112 formed on the metal traces 111 to isolate the metal traces 111, an image sensor chip 120 electrically connected to the metal traces 111 of the glass substrate 110 by flip-chip solder joints 113, and passive elements 117 and connection terminals 116 that are mounted on the metal traces 111 at the outside of the image sensor chip 120. Here, the passive elements 117 include decoupling capacitors. Also, the image sensor package further includes an IR cut-off filter 130 coated on the other side of the glass substrate 110.

The image sensor package according to this exemplary embodiment shown in FIG. 4 has the configuration almost similar to that of the image sensor package shown in FIG. 2. However, the image sensor package shown in FIG. 4 has the configuration in which the passive elements 117 such as decoupling capacitors required in constituting a camera module can be mounted together on the glass substrate 110 and the connection terminals 116 for connecting the glass substrate 110 to a printed circuit board are provided on one surface of the glass substrate 110. In this case, no printed circuit board may be used. Accordingly, as shown in FIG. 5, an adhesive 350a is applied to the other side of the glass substrate 110, and the glass substrate 110 adheres to a horizontal portion 310 between an extending portion 320 and a protruding portion 340 of a lens housing 300, so that the lens housing 300 is fixed to the glass substrate 110.

Meanwhile, in addition to the aforementioned exemplary embodiments, a variety of image sensor packages may be employed. For example, a COB, CSP or COF type image sensor package, which is widely used in a prior art, may be applied to the present invention.

Figure 6:
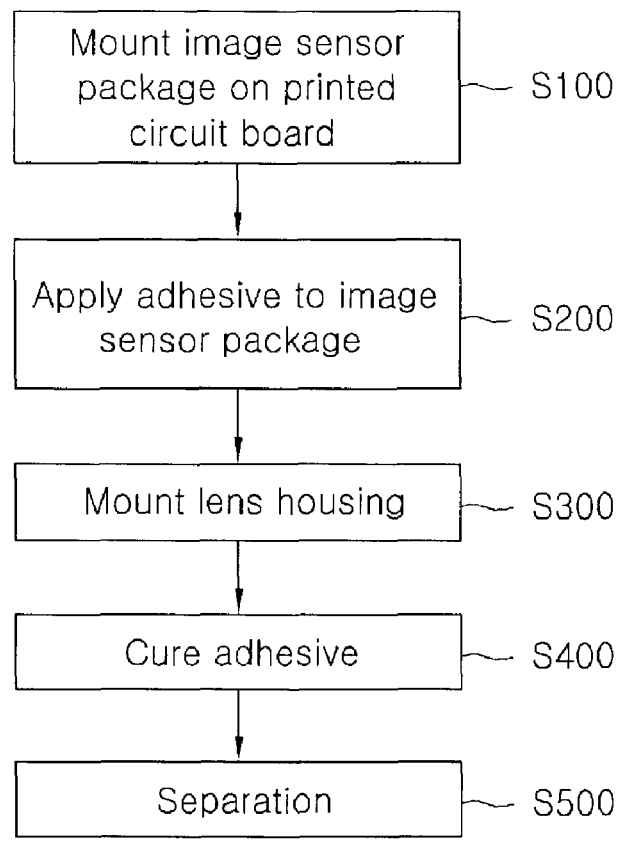
FIG. 6 is a flowchart illustrating a method of manufacturing an image sensor camera module according to an exemplary embodiment of the present invention.

FIG. 6 is a flowchart of a method of manufacturing an image sensor camera module according to an exemplary embodiment of the present invention, and FIGS. 7 to 10 are sectional views illustrating the method of manufacturing an image sensor camera module according to the exemplary embodiment of the present invention. Referring to FIGS. 7 to 10, the method of manufacturing an image sensor camera module according to the exemplary embodiment of the present invention will be described as follows.

Figure 7:
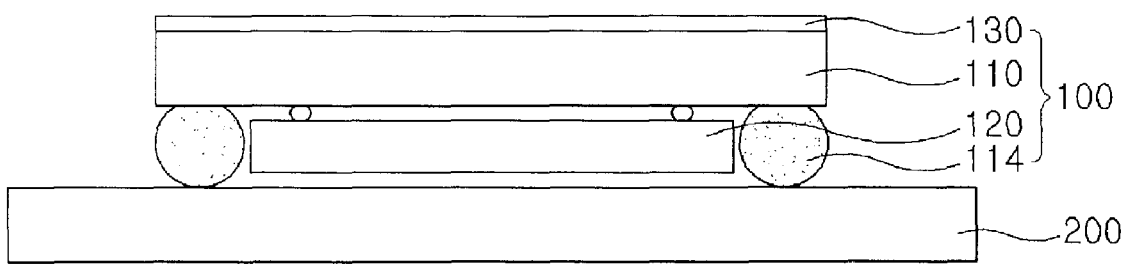
FIGS. 7 to 10 are sectional views illustrating the method of manufacturing an image sensor camera module according to the exemplary embodiment of the present invention.

First of all, as shown in FIG. 7, an image sensor package 100 is mounted to a printed circuit board 200 (S100). The image sensor package 100 includes a glass substrate 110, an image sensor chip 120 electrically connected to metal traces formed on one side of the glass substrate 110 by flip-chip solder joints, and an IR cut-off filter 130 coated on the other side of the glass substrate 110. Also, the printed circuit board 200 is formed with a circuit pattern (not shown), and passive elements (not shown) such as decoupling capacitors may be mounted in a working area on the printed circuit board 200. The image sensor package 100 is mounted on the printed circuit board 200 in such a manner that the circuit pattern (not shown) of the printed circuit board 200 is electrically connected to connection terminals 114 of the sensor package 100, e.g., solder balls or the like.

Figure 8:
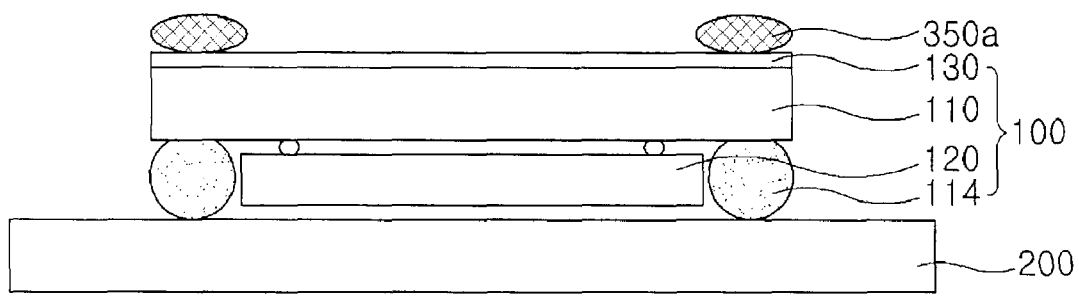

Subsequently, as shown in FIG. 8, an adhesive 350a is applied to a top surface of the image sensor package 100, i.e., an edge of the glass substrate 110 (S200). The adhesive 350a may include a heat-cure adhesive cured at a predetermined temperature or a UV-cure adhesive cured by UV. For example, when a plastic lens is used, an adhesive cured at a temperature of 80° C. may be used as the heat-cure adhesive. In case of a glass lens, an adhesive cured at a temperature of 100 to 150° C. may be used as the heat-cure adhesive. It will be apparent that when the glass lens is used, the curing temperature of the heat-cure adhesive may be increased. In this case, curing time can be reduced.

Figure 9:
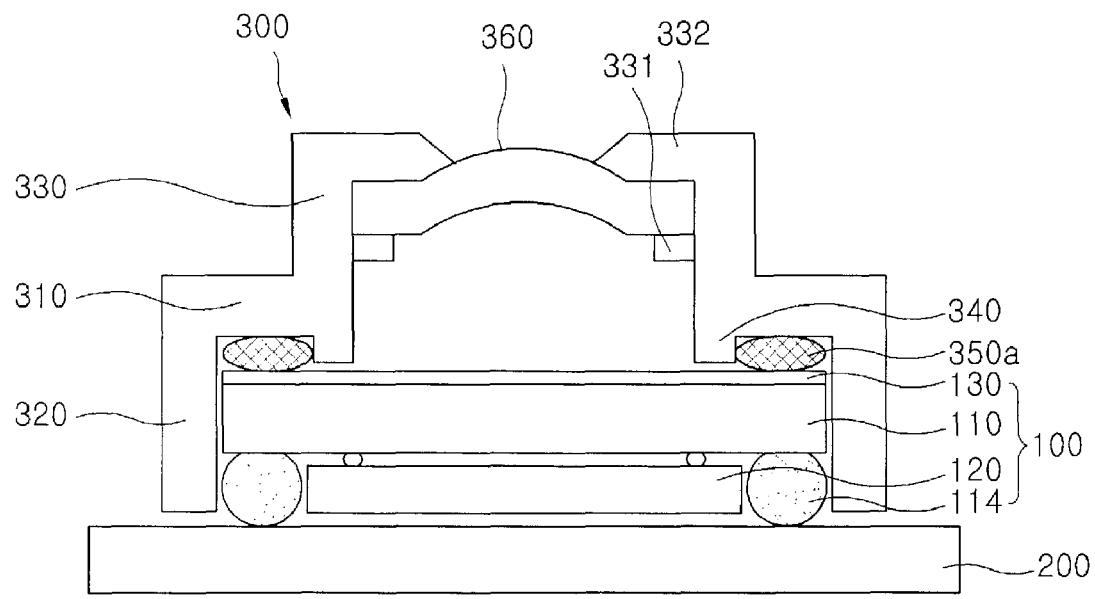

As shown in FIG. 9, a lens housing 300 is prepared. The lens housing 300 includes a horizontal portion 310, an extending portion 320 extending downwardly from an outer edge of the horizontal portion 310, a lens seating portion 330 extending upwardly from an inner edge of the horizontal portion 310, and a protruding portion 340 protruding downwardly from an inside of the horizontal portion 310. A lens support portion 331 and a lens fixing portion 332 are provided inside of the lens seating portion 330 so that a lens 360 is seated between the lens support portion 33 1 and the lens fixing portion 332. At this time, the lens support portion 331 may be formed to be detachably coupled to the lens housing 300, and the lens fixing portion 332 may be formed integrally with the lens housing 300. In this case, the lens 360 may be fixed to the lens housing 300 by turning over the lens housing 300 having the lens support portion 331 separated therefrom, inserting the lens 360 into the lens fixing portion 332 and then coupling the lens support portion 331 to the lens housing 300. Alternatively, the lens support portion 331 may be formed integrally with the lens housing 300, and the lens fixing portion 332 may be formed to be detachably coupled to the lens housing 300. In this case, the lens may be fixed to the lens housing 300 by separating the lens fixing portion 332 from the lens housing 300, inserting the lens 360 into the lens support portion 331 and then coupling the lens fixing portion 332 to the lens housing 300. Here, at least two lenses 360 may be seated in the lens housing 300, and a spacer (not shown) may be interposed between the lenses 360 so that a gap between the lenses 360 can be maintained or controlled. In addition, the lens housing 300 is mounted so that a space between the protruding portion 340 and the extending portion 320 is positioned on the adhesive 350a applied to the glass substrate 110 (S300).

Figure 10:
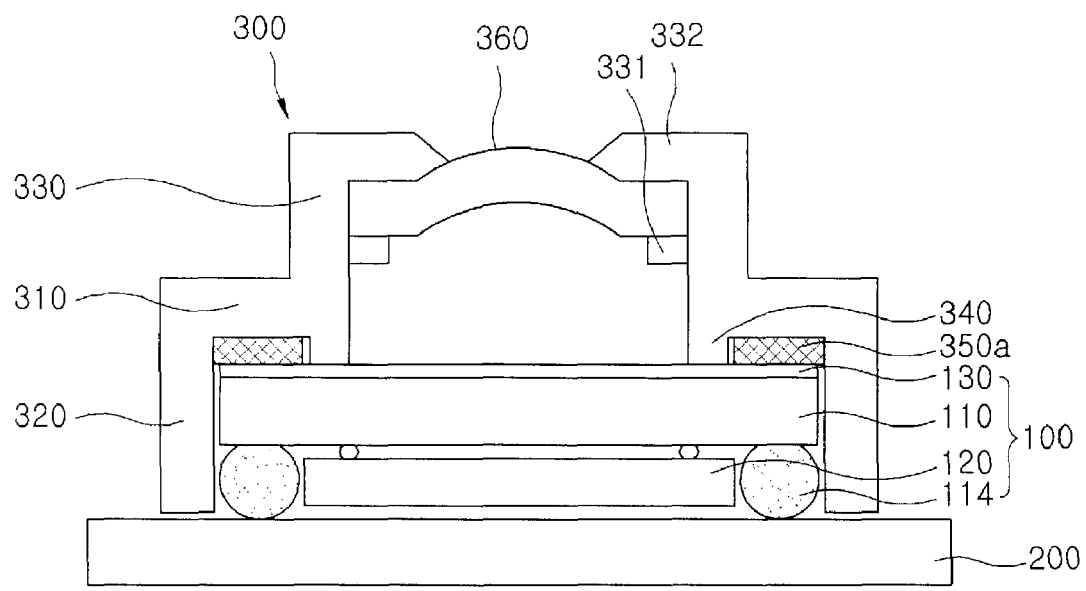

Subsequently, as shown in FIG. 10, the adhesive 350a is cured (S400). At this time, when a heat-cure adhesive is used as the adhesive 350a, the adhesive 350a is cured in an oven at a predetermined temperature while pressure is applied to a top surface of the lens housing 300, preferably the lens fixing portion 332, using a jig. In the meantime, when a UV adhesive is used as the adhesive 350a, the adhesive 350a is cured by irradiating the adhesive 350a with UV light while pressure is applied to the top surface of the lens housing 300.

Subsequently, in a case of a printed circuit board 200 on which a plurality of individual units are arranged, the printed circuit board 200 is separated into individual units (S500). The separation may be performed by a punching method, a sawing method or a 30 laser cutting method. In the meantime, when processes are performed for respective individual units, the separation process is not performed.

Meanwhile, in this exemplary embodiment, after the adhesive 350a is applied only on the glass substrate 110, the lens housing 300 is mounted and adheres to the glass substrate 110. However, the lens housing may adhere to the glass substrate by mounting the lens housing 300 on the glass substrate 110 and then injecting the adhesive 350a between the lens housing 300 and the glass substrate 110 positioned between the protruding portion 340 and the extending portion 320. Alternatively, the lens housing 300 may adhere to the printed circuit board 200 in addition to the glass substrate 110. In this case, the lens housing 300 may adhere to the glass substrate 110 and the printed circuit board 200 in such a manner that the adhesive 350a is applied to the glass substrate 110, the horizontal portion 310 is brought into contact with the glass substrate 110 and then the adhesive 350a is injected between the extending portion 320 and the printed circuit board 200 and cured. Alternatively, the adhesive is applied to the glass substrate 110 and the printed circuit board 200, respectively, and then the lens housing 300 may fixedly adhere thereto. Alternatively, the lens housing 300 may adhere to the glass substrate 110 and the printed circuit board 200 in such a manner that the adhesive 350a is applied to the glass substrate 110 and an adhesive is applied to a bottom surface of the extending portion 320 by dipping the bottom surface of the extending portion 320 in an adhesive stage.

Figure 11:
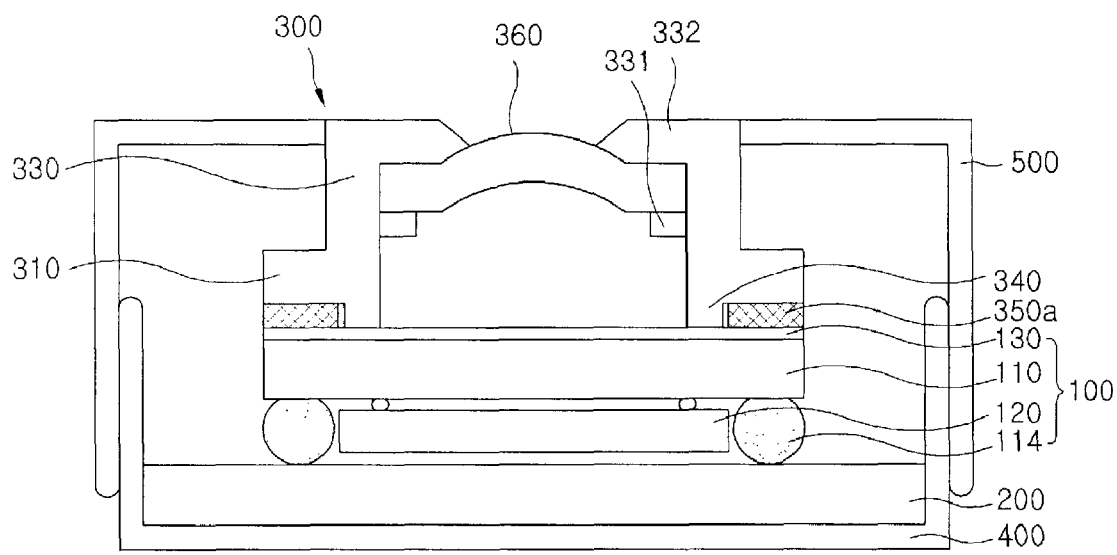
FIGS. 11 to 13 are sectional views of image sensor camera modules according to modifications of the present invention.

Meanwhile, the present invention may be variously modified in addition to the exemplary embodiments. As shown in FIG. 11, an extending portion is removed from the lens housing 300, and a lens housing 300 is provided only with a horizontal portion 310 and a lens seating portion 330. A camera module is inserted into a rectangular hexahedral socket 400 having an open top, and a shield can 500 may be covered so that the top of the camera module is open and a side of the socket 400 is surrounded.

Figure 12:
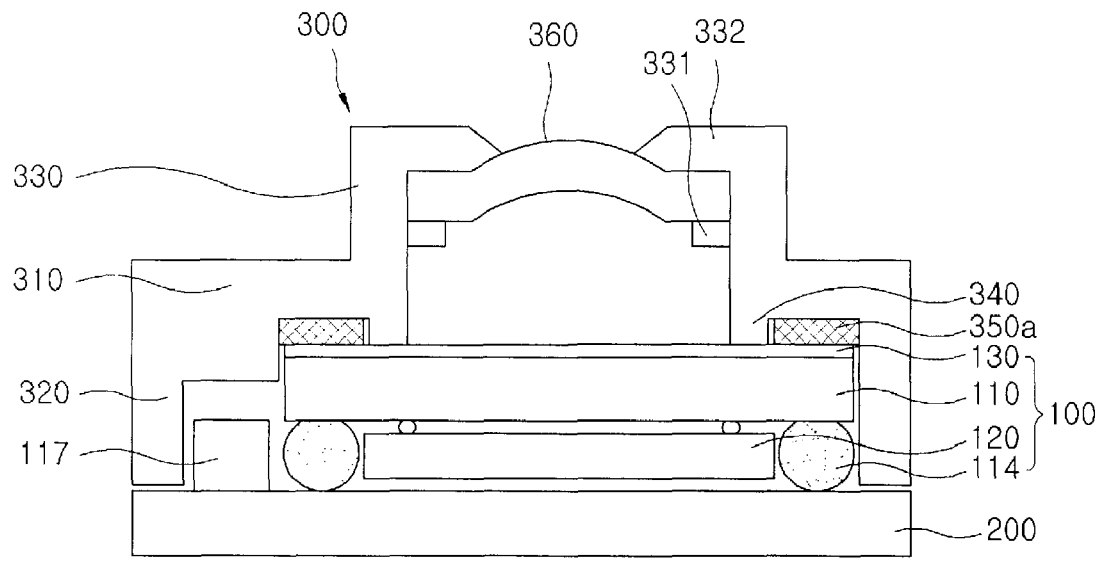

Also, as shown in FIG. 12, the lens housing 300 may be modified to surround a passive element 117 such as a decoupling capacitor. That is, the lens housing 300 may be modified so that an extending portion 320 also surrounds the passive element by extending the horizontal portion 310 in a horizontal direction. At this time, when the passive element 117 has a height lower than that of an image sensor package 100, the lower portion of the horizontal portion 310 may partially protrude.

Figure 13:
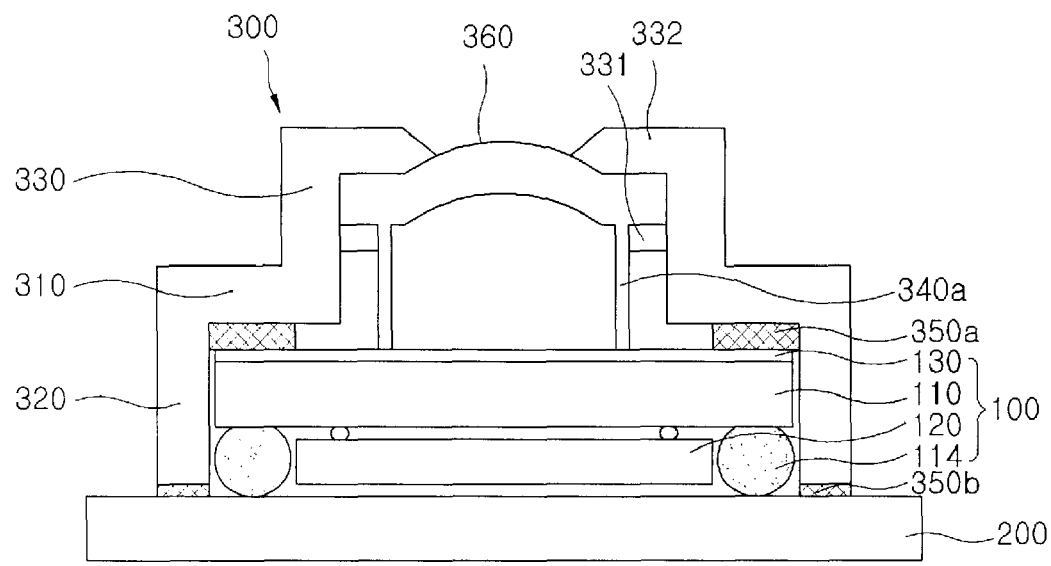

As shown in FIG. 13, the distance between an image sensor chip 120 and a lens 360 may be maintained not using a protruding portion of the lens housing 300 but using the lens 360. To this end, by forming a protruding portion 340a protruding downwardly from the lens 360 when an injection molding process is formed, fixing the lens 360, and causing the lens housing 300 to adhere to the a top of the glass substrate 110, the protruding portion 340a protruding from the lens 360 can allow the distance between the image sensor chip 120 and the lens 360 to maintain. At this time, the length of the protruding portion 340a may be adjusted depending on the distance between the image sensor chip 120 and the lens 360.

In an image sensor camera module according to the present invention, a lens housing having a lens mounted thereto adheres to an image sensor package. Also, there is provided a protruding portion for maintaining a distance between the lens and the image sensor package. The image sensor package and the lens housing adhere to an outside of the protruding portion, and the protruding portion prevents an adhesive for allowing the image sensor package to adhere to the lens housing from penetrate into an image region. Further, an IR filter can be attached to the top surface of the image sensor package.

According to the present invention, since a lens barrel is not used and a focus adjusting process is not performed, the process simplification and automation process can be achieved, thereby saving a manufacturing cost and obtaining uniform focus quality.

Further, it is possible to prevent an image defect from being generated by foreign substances that are produced in a conventional image sensor camera module using a lens barrel, thereby improving a yield.

Meanwhile, an IR cut-off filter is coated on the image sensor package, or an IR cut-off film is attached to the image sensor package, so that even when a flange back length (FBL) is short, it is possible to manufacture a camera module, thereby reducing the height of the camera module.

Although the preferred exemplary embodiments have been described herein with reference to the accompanying drawings, it is to be understood that the present invention is not limited to those preferred exemplary embodiments, and that various other changes and modifications may be affected therein by one of ordinary skill in the related art without departing from the scope or spirit of the invention. All such changes and modifications are intended to be included within the scope of the invention as defined by the appended claims.

What is claimed is:

1. An image sensor camera module, comprising:
   a lens;
   a lens housing where the lens is mounted;
   an image sensor package adhering to a portion of an inside of the lens housing; and
   a protruding portion for maintaining a gap between the lens and the image sensor package,
   wherein the image sensor package adheres to the lens housing at an outside of the protruding portion,
   wherein the image sensor package comprises a glass substrate; a metal trace selectively formed on one side of the glass substrate; an image sensor chip electrically connected to the metal trace of the glass substrate; and an IR cut-off filter coated on the other side of the glass substrate, and
   wherein the protruding portion is in contact with a top surface of the glass substrate.

2. The image sensor camera module of claim 1, wherein the lens housing comprises a horizontal portion positioned in parallel with the image sensor package; and a lens seating portion extending upwardly from an inner edge of the horizontal portion to allow the lens to be seated thereon.

3. The image sensor camera module of claim 2, wherein the lens housing further comprises an extending portion extending downwardly from an outer edge of the horizontal portion.

4. The image sensor camera module of claim 2, wherein the protruding portion extends downward from an inside of the horizontal portion.

5. The image sensor camera module of claim 1, wherein the protruding portion extends downward from the lens.

6. The image sensor camera module of claim 3, further comprising a printed circuit board on which the image sensor package is mounted.

7. The image sensor camera module of claim 6, wherein a bottom surface of the extending portion further adheres to a top surface of the printed circuit board.

8. The image sensor camera module of claim 6, further comprising a passive device provided in a working area on the printed circuit board.

9. A method of manufacturing an image sensor camera module, comprising:
   providing an image sensor package by electrically connecting a metal trace of a glass substrate and an image sensor chip, the glass substrate having the metal trace formed on one side thereof and an IR cut-off filter provided on the other side thereof;
   mounting the image sensor package onto a printed circuit board;
   preparing a lens housing where a lens is mounted, the lens housing provided with a protruding portion for maintaining a gap between the lens and the image sensor package;
   adhering the lens housing to the image sensor package using an adhesive so that the glass substrate of the image sensor package is in contact with the protruding portion of the lens housing; and
   curing the adhesive,
   wherein the lens housing is mounted so that the adhesive is positioned at the outside of the protruding portion.

10. The method of claim 9, wherein adhering the lens housing to the image sensor package comprises mounting the lens housing to the image sensor package after the adhesive is applied to the image sensor package.

11. The method of claim 9, adhering the lens housing to the image sensor package comprises injecting the adhesive between the lens housing and the image sensor package after the lens housing is mounted onto the image sensor package.

12. The method of claim 9, wherein the lens housing is formed to have an extending portion surrounding an outside of the image sensor package.

13. The method of claim 12, wherein an adhesive is applied to a bottom surface of the extending portion, and then, the lens housing is mounted.

14. The method of claim 12, further comprising injecting an adhesive between the extending portion and the printed circuit board after mounting the lens housing onto the image sensor package.

* * * * *